US008410816B1

(12) United States Patent
Liu et al.

(10) Patent No.: US 8,410,816 B1
(45) Date of Patent: Apr. 2, 2013

(54) LOW-SWING SIGNALING SCHEME FOR DATA COMMUNICATION

(75) Inventors: Yong Liu, Rye, NY (US); Wing Kin Luk, Chappaqua, NY (US); Daniel Joseph Friedman, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/370,144

(22) Filed: Feb. 9, 2012

(51) Int. Cl.
*H03K 19/094* (2006.01)
(52) U.S. Cl. .................. 326/81; 326/83; 326/68
(58) Field of Classification Search ............. 326/68–70, 326/80, 81, 83
See application file for complete search history.

(56) References Cited

U.S. PATENT DOCUMENTS

| | | | | |
|---|---|---|---|---|
| 4,918,341 | A * | 4/1990 | Galbraith et al. | 327/51 |
| 5,559,455 | A * | 9/1996 | McPartland | 327/53 |
| 6,657,474 | B2 | 12/2003 | Varadarajan | |
| 6,801,577 | B2 | 10/2004 | Ranganathan et al. | |
| 7,116,594 | B2 | 10/2006 | Luk et al. | |
| 7,242,629 | B2 * | 7/2007 | Luk et al. | 365/205 |
| 7,305,045 | B2 | 12/2007 | Ranganathan et al. | |
| 7,741,873 | B2 | 6/2010 | Hollis et al. | |
| 2003/0155948 | A1 * | 8/2003 | Chung et al. | 327/51 |
| 2005/0145895 | A1 | 7/2005 | Luk et al. | |
| 2008/0043855 | A1 | 2/2008 | Krishnan et al. | |

OTHER PUBLICATIONS

Fukuda, K.-et al.; "A 122-mV 12.5-Gb/s Complete Transceiver in 65-nm CMOS Process"; IEEE Journal of Solid-State Circuits, vol. 45, No. 12, pp. 2838-2849; Dec. 2010.
Palmer, R.-et al; "Design Considerations for Low-Power High-Performance Mobile Logic and Memory Interfaces", IEEE Asian Solid-State Circuits Conference; pp. 205-208; 2008.
Zhang, H.-et al.; "Low-Swing On-Chip Signaling Techniques: Effectiveness and Robustness"; IEEE Transactions on Very Large Scale Integration Systems; vol. 8, No. 3, Jun. 2000; pp. 264-272.
Goodman, J.; "High Speed Inter-Chip Signaling in CMOS"; www-mtl.mit.edu/researchgroups/icsyst; Area Exam; May 5, 2000; pp. 1-48.
Sidiropoulos, S.; "High Performance Inter-Chip Signaling"; Dept. of Electrical Engineering & Computer Science, Stanford Univ.; Tech Rpt No. CSL-TR-98-760; Apr. 1998.
Ng, E.-et al.; "Low Power Gbit/sec Low Voltage Differential I/O System"; Electrical Engineering and Computer Science, Univ of California; 2000-2001; pp. 1-7.

* cited by examiner

*Primary Examiner* — Don Le
(74) *Attorney, Agent, or Firm* — Anne V. Dougherty, Esq.; Otterstedt, Ellenbogen & Kammer, LLP (57) ABSTRACT

A low-swing receiver includes a sense amplifier including a first transistor having a source connected with a first voltage supply and a gate for receiving a control signal, and a second transistor having a source connected with a second voltage supply, a drain connected to a drain of the first transistor, and a gate coupled to a second control signal via a capacitive element. A switching circuit is operative to selectively couple an input signal supplied to the sense amplifier with the gate of the second transistor as a function of a signal generated at an output of the sense amplifier. The sense amplifier is operative in a first mode to store charge in the capacitive element, and is operative in a second mode to impart a voltage on the gate of the second transistor which is indicative of the charge stored in the capacitive element.

27 Claims, 9 Drawing Sheets

LOW-SWING SIGNALING SCHEME FOR DATA COMMUNICATION

FIELD OF THE INVENTION

The present invention relates generally to the electrical, electronic, and computer arts, and more particularly relates to data processing and communication systems.

BACKGROUND

In on-chip and inter-chip data communication systems in which high data bandwidth is required, efficiently managing power dissipation and input/output (I/O) area is crucial. For instance, modern multi-core microprocessors typically have thousands of bits of on-chip data buses connecting processor cores and caches. Similarly, in high-performance servers, inter-chip connections (i.e., links) from processors to network switches or off-chip cache often require I/O buses hundreds of bits wide running at multiple gigabits per second (Gb/s) per-lane data rates. Compact and low-power I/O schemes are needed for these high-performance systems.

Among various circuit blocks in an I/O system, signaling power dissipated on a communication channel established with the I/O system consumes a significant portion of the overall I/O power. Since signaling power associated with a given signal is proportional to a square of the voltage swing of the signal transmitted on the channel, it is well known that reducing the signal swing will reduce the signaling power. However, low-swing signaling undesirably reduces the amplitude and signal-to-noise ratio of the signal received by a receiver, thereby creating a receiver sensitivity challenge. Realizing highly sensitive receivers running at multiple Gb/s data rates traditionally results in designs that are complex (and may even demand increased complexity in the transmitter design as well), with an adverse result of increased receiver and/or overall link power and associated area.

For example, U.S. Pat. No. 6,801,577 to Ranganathan et al. discloses a receiver based on a trans-impedance amplifier which transforms a received current signal into a corresponding voltage signal. However, this type of amplifier consumes considerable power to support high-speed signaling beyond a Gb/s data rate. Likewise, in a paper by Hui Zhang et al. entitled "Low-Swing On-Chip Signaling Techniques: Effectiveness and Robustness," *IEEE Transactions on Very Large Scale Integration Systems*, Vol. 8, No. 3, pp. 264-272, June 2000, a detailed discussion is presented regarding low-swing on-chip interconnection schemes employing receivers that are either complex or consume significant power, making them poorly suited for applications requiring low power and/or compactness.

SUMMARY

Advantageously, aspects of the present invention provide a low-swing signaling scheme and circuits that incorporate a compact low-power receiver with high sensitivity based on gated-diode sensing. This scheme addresses the power and area issues normally associated with low-swing signaling schemes for data communication systems. In addition, embodiments of the invention present circuits to reduce receiver leakage power and an auto-calibration scheme to enhance the accuracy of the receiver by reducing the effect of silicon process variability presented in sub-micron technology on circuit transistors.

In accordance with one embodiment of the invention, a receiver adapted to receive an input signal having a first voltage swing and to generate an output signal having a second voltage swing includes at least one sense amplifier. The sense amplifier includes a first transistor having a source adapted for connection with a first voltage supply and a gate adapted for receiving a first control signal, and a second transistor having a source adapted for connection with a second voltage supply, a drain connected to a drain of the first transistor, and a gate coupled to a second control signal via a capacitive element. The sense amplifier further includes a switching circuit operative to selectively couple the input signal with the gate of the second transistor as a function of a signal generated at a first output of the sense amplifier. The sense amplifier is operative in a first mode to store charge in the capacitive element, and is operative in a second mode to impart a voltage on the gate of the second transistor which is indicative of the charge stored in the capacitive element.

In accordance with another embodiment of the invention, an I/O interface circuit includes a plurality of receivers, each of at least a subset of the receivers being adapted to receive an input signal having a first voltage swing and to generate an output signal having a second voltage swing, the second voltage swing being greater than the first voltage swing. At least one of the receivers includes at least one sense amplifier including a first transistor having a source adapted for connection with a first voltage supply and a gate adapted for receiving a first control signal, and a second transistor having a source adapted for connection with a second voltage supply, a drain connected to a drain of the first transistor, and a gate coupled to a second control signal via a capacitive element. The sense amplifier further includes a switching circuit operative to selectively couple the input signal with the gate of the second transistor as a function of a signal generated at a first output of the sense amplifier. The sense amplifier is operative in a first mode to store charge in the capacitive element, and is operative in a second mode to impart a voltage on the gate of the second transistor which is indicative of the charge stored in the capacitive element.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Embodiments of the present invention will be described herein in the context of illustrative apparatus (e.g., receivers, transmitters, interconnections, etc.) and methods incorporating a compact, low-swing signaling scheme suitable for use, for example, in a data communication system. The term "voltage swing," or simply "swing," as used herein is intended to refer to the peak-to-peak output voltage level of a device or circuit; the term "low-swing" is intended to refer broadly to a peak-to-peak output voltage which is much less than prescribed levels (typically, the supply voltage in I/O circuits). It is to be appreciated, however, that the invention is not limited to the specific apparatus and methods illustratively shown and described herein; nor is the invention limited to a data communication system application. Rather, embodiments of the invention are directed more broadly to low-swing signaling techniques for beneficially reducing power consumption and chip area utilization. Moreover, it will become apparent to those skilled in the art given the teachings herein that numerous modifications can be made to the embodiments shown that are within the scope of the present invention. That is, no limitations with respect to the specific embodiments described herein are intended or should be inferred.

For the purpose of describing and claiming aspects of the invention, the term MISFET as used herein is intended to be construed broadly and to encompass any type of metal-insulator-semiconductor field effect transistor. The term MISFET is, for example, intended to encompass semiconductor field effect transistors that utilize an oxide material as their gate dielectric (i.e., a metal-oxide-semiconductor field effect transistor (MOSFET)), as well as those that do not. In addition, despite a reference to the term "metal" in the acronym MISFET, the term MISFET is also intended to encompass semiconductor field effect transistors wherein the gate is formed from a non-metal, such as, for instance, polysilicon.

Although implementations of the present invention described herein may be implemented using p-channel MISFETs (hereinafter called "PFETs" or "PMOS" transistor devices) and re-channel MISFETs (hereinafter called "NFETs" or "NMOS" transistor devices), as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), transistors based on carbon nanotube, carbon nanowire or graphene, etc., and/or fabrication processes (e.g., bipolar, BiCMOS, etc.), may be similarly employed, as will be understood by those skilled in the art. Although embodiments of the invention are typically fabricated in a silicon wafer, embodiments of the invention can alternatively be fabricated in wafers comprising other materials, including but not limited to gallium arsenide (GaAs), indium phosphide (InP), etc.

Moreover, while a transistor of one conductivity type (e.g., NMOS) may be shown in the figures, it is to be appreciated that a transistor of a complementary conductivity type (e.g., PMOS) may be used in substitution therefor, with little or no change in functionality, with or without modification of the circuit, as will be understood by those skilled in the art. For example, an NMOS device operating as a switch can be replaced by a functionally equivalent PMOS device by inverting the logic signal driving a gate of the device.

Figure 1:
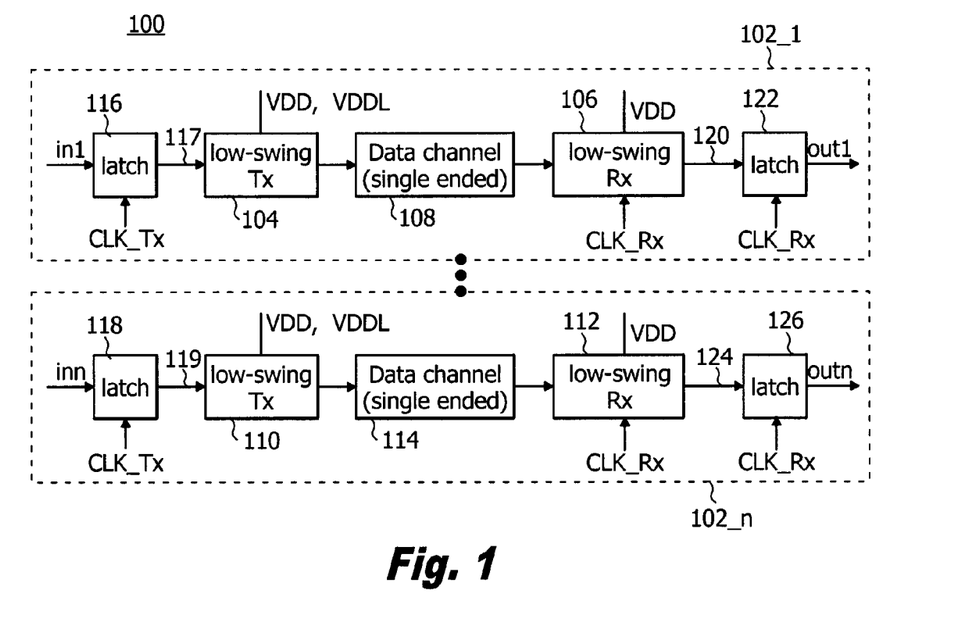
FIG. 1 is a block diagram depicting at least a portion of an exemplary low-swing data communication system in which techniques of the present invention may be employed, according to an embodiment of the invention.

FIG. 1 is a block diagram depicting at least a portion of an exemplary low-swing data communication system 100 in which techniques of the present invention may be employed, according to an embodiment of the invention. The data communication system 100 includes a plurality of data signal paths 102_1 through 102_n, where n is an integer. It is to be understood that the invention is not limited to any specific number of signal paths utilized in the system 100. Moreover, the respective signal paths may be independent of one another, or two or more signal paths may be used together, such as, for example, in the case of a differential signaling scheme.

Each of the respective signal paths in the system 100 comprises three primary components; namely, a low-swing transmitter, a low-swing receiver, and a communication channel established between the transmitter and receiver. Specifically, a first one of the signal paths 102_1 includes a low-swing transmitter (Tx) 104, a low-swing receiver (Rx) 106, and a data channel 108, or alternative communication medium, established between the transmitter and receiver. Similarly, a second one of the signal paths 102_n includes a low-swing transmitter 110, a low-swing receiver 112, and a data channel 114, or alternative communication medium, established between the transmitter and receiver. Data channels 108 and 114 are shown as single-ended channels, although one skilled in the art will recognize that one or more of the data channels may be differential channels, in alternative embodiments.

On the transmitter side of the channel, input data provided to each signal path, in this embodiment, is retimed using a latch, or alternative synchronization circuitry, coupled in series with an input of the low-swing transmitter associated with a given signal path. More particularly, a first input data signal, in1, is supplied to a data input of a first latch 116 in signal path 102_1. The latch 116 is operative to receive a transmit clock signal, CLK_Tx, at a clock input thereof and to generate a retimed input data signal 117 at an output of the latch 116. Similarly, a second input data signal, inn, is supplied to a data input of a first latch 118 in signal path 102_n. The latch 118 is operative to receive a transmit clock signal, CLK_Tx, at a clock input thereof and to generate a retimed input data signal 119 at an output of the latch 118. The same transmit clock signal CLK_Tx may be supplied to corresponding latches in all of the signal paths. Conversely, in other embodiments, two of more signal paths may receive different transmit clock signals.

On the receiver side, output data generated by each signal path, in this embodiment, is retimed using a latch circuit coupled in series with an output of the low-swing receiver associated with a given signal path, for example, in a manner consistent with that shown on the transmitter side. More particularly, an output signal 120 generated by the low-swing receiver 106 in signal path 102_1 is supplied to a data input of a second latch 122 in signal path 102_1. The latch 122 is operative to receive a receive clock signal, CLK_Rx, at a clock input thereof and to generate a retimed output data signal, out1, at an output of the latch 122. The receive clock signal CLK_Rx is preferably the same clock signal supplied to the low-swing receiver 106 so that the receiver 106 and latch 122 are synchronized. Similarly, an output signal 124 generated by the low-swing receiver 112 in signal path 102_n is supplied to a data input of a second latch 126 in signal path 102_n. The latch 126 is operative to receive a receive clock signal, CLK_Rx, at a clock input thereof and to generate a retimed output data signal, outn, at an output of the latch 126. The receive clock signal CLK_Rx supplied to the latch 126 is preferably the same clock signal supplied to the low-swing receiver 112.

The same receive clock signal CLK_Rx may be supplied to corresponding latches in all of the signal paths. Conversely, in other embodiments, two of more signal paths may receive different receive clock signals. Moreover, in some embodiments of the invention, the receive clock signal CLK_Rx can be the same as the transmit clock signal CLK_Tx, or have the same clock phase as CLK_Tx, when the invention is applied to on-chip signaling or three-dimensional (3D) inter-chip I/O, where channel delay is less than one clock cycle. In other embodiments, the receive clock signal CLK_Rx can be derived from the received data or from a forwarded clock in the case of source synchronous buses.

The input data signals in1 through inn supplied to the signal paths 102_1 through 102_n, respectively, may be full-swing voltage levels, having an amplitude of a first prescribed voltage, which may be voltage supply VDD (e.g., 1.0 volt). The low-swing transmitter in a given one of the signal paths is operative to convert the full-swing voltage level (with amplitude VDD) to a reduced-swing (i.e., low-swing) signal, having an amplitude of a second prescribed voltage, which may be VDDL (e.g., 0.3 volt). It is to be understood that the invention is not limited to any specific voltage levels for VDD or VDDL, although it is intended that an absolute value of the full-swing voltage levels be greater than an absolute value of the reduced-swing (low-swing) voltage levels.

The reduced-swing signals generated by the low-swing transmitters 104, 110 in each of the signal paths are communicated to one or more receivers via the corresponding data channels 108, 114. Any one of the data channels 108, 114 may comprise of one or more of various known transmission mediums, wired and/or wireless, including, but not limited to, on-chip wiring, off-chip silicon carrier channels, off-chip standard interconnect wiring, inter-chip interconnects in a three-dimensional (3D) chip stack, infrared, optical, etc. To save wiring area, single-ended signaling (shown) is desirable, but differential signaling can also be used in the context of the subject invention, as will become apparent to those skilled in the art given the teachings herein. Illustrative channel arrangements suitable for use with embodiments of the invention are depicted in FIG. 2.

The reduced-swing signals conveyed by the respective data channels 108, 114 are received by a corresponding one of the low-swing receivers 106, 112. More particularly, the low-swing signals having a peak amplitude of VDDL generated by the low-swing transmitters 104, 110 and communicated via the data channels 108, 114 are sensed and amplified to full-swing signals having a peak amplitude of VDD by the corresponding low-swing receivers 106, 112.

Figure 2:
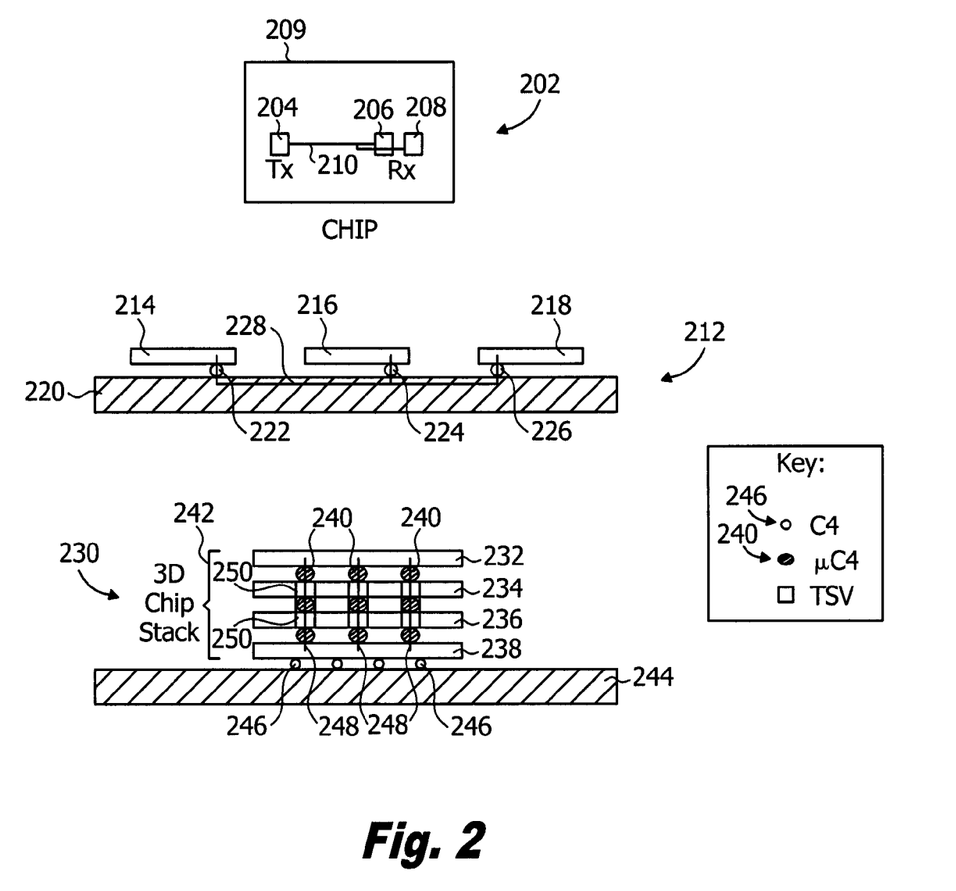
FIG. 2 are top plan and cross-sectional views depicting at least a portion of exemplary channel arrangements suitable for use in conjunction with embodiments of the invention.

FIG. 2 are top plan and cross-sectional views depicting at least a portion of exemplary channel arrangements suitable for use in conjunction with embodiments of the invention. It is to be appreciated that the invention is not limited to the specific channel arrangements shown. A first example depicts a top plan view of at least a portion of an illustrative connection arrangement 202 which includes a transmitter 204 and a plurality of receivers, 206 and 208, residing on a same chip 209. The connection arrangement 202 further includes a data channel implemented as an on-chip interconnect 210 coupled between the transmitter 204 and receivers 206, 208. In connection arrangement 202, transmit clock and receive clock signals can be supplied by the same clock distribution network.

A second example depicts a cross-sectional view of at least a portion of an illustrative connection arrangement 212 which includes a plurality of chips, 214, 216 and 218, attached to a silicon carrier 220, or an alternative substrate, via a plurality of corresponding bump interconnect structures 222, 224 and 226 (e.g., controlled collapse chip connection (C4) interconnects), such as, for example, in a flip-chip arrangement. The multiple chips 214, 216 and 218 communicate with one another over a plurality of potentially dense channels 228 realizable in this technology. In this embodiment, transmit and receive clock signals are typically different. The receive clock signal is often derived from the received data or from a forwarded clock, in the case of inter-chip data transfer mediated by source synchronous buses.

A third example depicts a cross-sectional view of at least a portion of an illustrative connection arrangement 230 implemented in a stacked structure. Specifically, connection arrangement 230 includes a plurality of chips, 232, 234, 236 and 238, mounted together in a stacked configuration using a plurality of corresponding bump interconnect structures 240, which may comprise, for example, micro-bump C4 (µC4) interconnects, or an alternative connection means. The chips 232, 234, 236 and 238, together with their corresponding interconnect structures 240, form a 3D chip stack 242. The chip stack 242 is attached to a silicon carrier 244, or alternative substrate (e.g., package module substrate), using a plurality of corresponding bump interconnect structures 246, which may be C4 interconnects, such as, for example, in a flip-chip arrangement.

The multiple chips 232, 234, 236 and 238 communicate with one another using a plurality of vertical channels 248 realizable in this technology. The vertical channels 248 are implemented using the interconnect structures 240 and a plurality of corresponding through-silicon via (TSV) interposers 250 which enable signals to pass through intermediate layer chips 234 and 236. In this embodiment, different chip layers in the 3D chip stack 242 can share the same clock domain. With the subject low-swing signaling scheme, very power-efficient latch-to-latch 3D I/O can be achieved.

Figure 3:
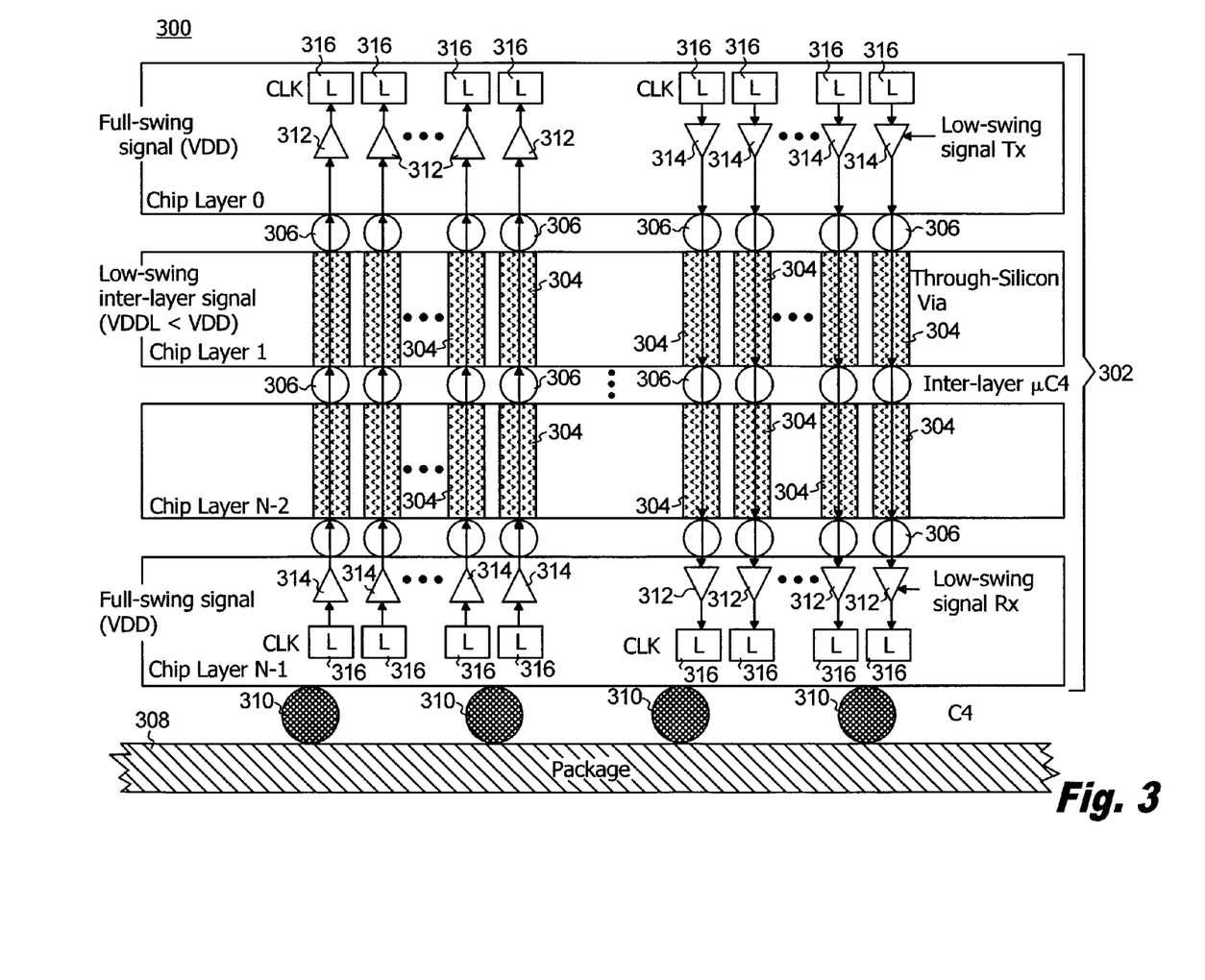
FIG. 3 is a cross-sectional view depicting at least a portion of an exemplary three-dimensional low-swing signaling bus structure in which embodiments of the invention may be employed.

By way of example only and without loss of generality, FIG. 3 is a cross-sectional view depicting at least a portion of an exemplary 3D low-swing signaling bus structure 300 in which embodiments of the invention may be employed. In the described embodiment, N chip layers, namely, chip layer 0 through chip layer N−1, where N is an integer, are affixed together substantially vertically to form a 3D chip stack 302. It is to be understood that the invention is not limited to any specific number of chip layers, nor is the invention limited to the specific 3D arrangement shown. Chip signal ports, which may be implemented as I/O pads or the like, on different chip layers are connected to each other using through-silicon vias (TSVs) 304 and corresponding micro-bump C4 (µC4) interconnects 306. The chip stack 302 is attached to a package substrate (e.g., silicon carrier) 308 using one or more interconnect structures 310 (e.g., C4 interconnects) which connect I/O pads on the substrate with corresponding pads on a bottom surface of chip layer N−1.

Intermediary chip layers 1 through N−2, in conjunction with the TSVs 304 and µC4 interconnects 306, serve as the data channels for conveying signals between chip layer 0 and chip layer N−1 of the chip stack 302. Each of chip layers 0 and N−1 (i.e., top and bottom chip layers of the chip stack 302, respectively) includes a plurality of low-swing receivers 312 and a plurality of low-swing transmitters (i.e., drivers) 314. An output of each of the transmitters 314 and an input of a corresponding one of the receivers 312 are coupled together through a corresponding one of the data channels (comprised of TSVs 304 and µC4 interconnects 306). A plurality of clocked latches 316 are also included in chip layers 0 and N−1 and are operative to synchronize either the input data to be sent by the transmitters 314 or the output data generated by the receivers 312, depending on whether they are used on the transmit or receive side, as previously described in conjunction with FIG. 1.

As previously explained, on the transmitter side, a full-swing data signal having an amplitude of VDD (e.g., 1.0 volt), or an alternative voltage level, supplied to a given transmitter 314 is converted to a low-swing signal having an amplitude of VDDL (e.g., 0.3 volt), or an alternative voltage level, by the transmitter and sent through a corresponding one of the data channels (one or more TSVs 304 and µC4 interconnects 306 forming the data channel) to which the transmitter is coupled. On the receiver side, a low-swing signal is received from the data channel to which a given receiver 312 is coupled by a sense amplifier (not explicitly shown) included in the receiver and is converted (e.g., amplified or scaled) back to a full-swing signal. The chip stack 302 provides a high data communication bandwidth among chips, thereby creating an efficient means to enable thousands of data bits to be transferred in parallel. The compact, low-power, low-swing signaling scheme according to embodiments of the invention offers a significant improvement in reducing I/O power consumption and area, compared to traditional off-chip I/O.

Figure 4A:
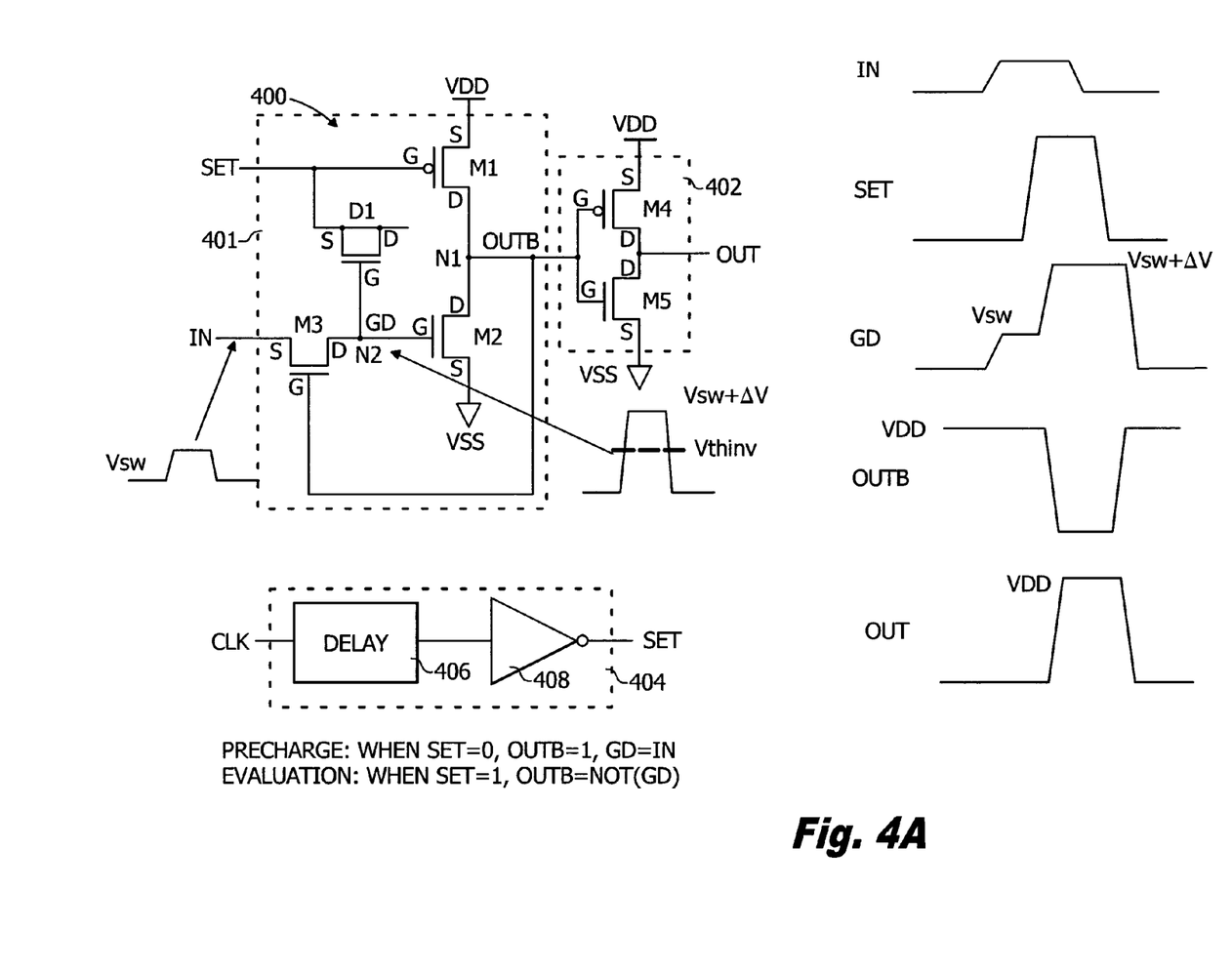
FIG. 4A is a schematic diagram depicting at least a portion of an exemplary low-swing receiver, according to an embodiment of the invention.

With reference now to FIG. 4A, a schematic diagram depicts at least a portion of an exemplary low-swing receiver 400, according to an embodiment of the invention. The receiver 400 includes a gated-diode sense amplifier 401 which forms an input stage of the receiver. The sense amplifier 401 comprises a first transistor, M1, of a first conductivity type (e.g., PMOS) and a first transistor, M2, of a second conductivity type (e.g., NMOS), a source (S) of M1 adapted for connection with a first voltage supply, which in this embodiment is VDD, a gate (G) of M1 adapted for receiving a first control signal, SET, a drain (D) of M1 connected with a drain of M2 at node N1, a source of M2 adapted for connection with a second voltage supply, which in this embodiment is VSS or ground, and a gate of M2 connected with node N2. Node N1 forms an output of the receiver 400 for generating a first output signal, OUTB. The sense amplifier 401 further includes a second NMOS transistor, M3, or an alternative switching element or circuit (e.g., transmission gate), having a drain connected with the gate of transistor M2 at node N2, a gate connected to node N1, and a source adapted for receiving a low-swing data input signal, IN A third NMOS transistor, D1, or an alternative capacitive element, is coupled between the gate of transistor M1 and the gate of transistor M2. Specifically, a drain and a source of transistor D1 are connected with the gate of transistor M1, and a gate of D1 is connected with the gate of transistor M2 at node N2. Transistor D1 is thus said to be connected in a gated-diode configuration, operative for signal amplification.

Although the source and drain of transistor D1 are shown as being connected together, it is to be appreciated that for gated-diode operation, it is sufficient to connect only the source or the drain; that is, one of either the source or the drain of D1 may be left unconnected (i.e., open) and the transistor device operated as a two-terminal device, according to other embodiments. This implementation has an advantage of a smaller layout area for the gated diode, without adverse effects, especially for gated-diode dimensions below a certain gate length.

Furthermore, it is to be appreciated that, because a metal-oxide-semiconductor (MOS) device is symmetrical in nature, and thus bidirectional, the assignment of source and drain designations in the MOS device is essentially arbitrary. Therefore, the source and drain may be referred to herein generally as first and second source/drain, respectively, where "source/drain" in this context denotes a source or a drain.

The receiver 400 may, optionally, include an output stage 402 having an input connected with node N1 and adapted to receive the first output signal OUTB, and an output adapted to generate a second output signal, OUT. In this embodiment, the output stage 402 is implemented as an inverting output stage and comprises a PMOS transistor, M4, and an NMOS transistor, M5, connected together in a standard inverter configuration. Specifically, a source of transistor M4 is adapted connection with VDD, a gate of M4 is connected with a gate of transistor M5 at node N1 and forms the input of the output stage 402, a drain of M4 is connected with a drain of M5 at node N3 and forms the output of the output stage, and a source of M5 is adapted for connection with VSS. With the output stage 402 connected in this manner, the second output signal OUT will be a logical complement of the first output signal OUTB. It is to be understood that the invention is not limited to an inverting output stage. Output stage 402 enables the receiver 400 to drive an external load without affecting the internal nodes of the receiver.

The receiver 400 may include a signal generator circuit 404, or alternative clocking circuit, operative to generate the first control signal SET as a function of a second control signal, which in this embodiment is a clock signal, CLK. More particularly, the signal generator circuit 404 includes a delay element 406 and an inverter 408 coupled together in series. The delay element 406 is operative to receive the clock signal CLK and to generate a delayed version of the clock signal at an output thereof. The inverter 408 is operative to receive the delayed version of the clock signal and to generate the first control signal SET at an output thereof.

In terms of operation, the low-swing receiver 400 operates in at least two distinct phases (i.e., modes); namely, a pre-charge phase and an evaluation phase. In the precharge phase, the clock signal CLK is a high logic level (e.g., VDD) and the control signal SET is a low logic level (e.g., VSS or 0). With SET low, transistor M1 turns on, thereby pulling the first output signal OUTB to a high logic level. Signal OUTB being high turns on transistor M3, making signal GD at node N2 substantially equal to the input signal IN (minus a source-to-drain voltage of transistor M3). The low-swing input signal IN, in the illustrative embodiment shown, has two voltage levels: 0 and Vsw. Here, Vsw is less than Vthinv, the threshold voltage of the inverter formed by at least transistor M2, although the invention is not limited to any specific voltage level for Vsw. Thus, regardless of the voltage level of the input signal IN, transistor M2 will remain either turned off or, in the case when IN is equal to Vsw, only weakly turned on (compared to transistor M1), thereby maintaining output signal OUTB at a high logic level and making the output signal OUT of the receiver 400 a low logic level.

In the evaluation phase, the clock signal CLK is a low level and control signal SET is a high level. The rising of the SET signal will be at least partially coupled to node N2 through the gated-diode transistor D1. The voltage of the signal GD (at the gate of D1) will be Vsw plus some incremental voltage, ΔV, coupled through D1. The level of the voltage ΔV will be a function of an effective gate-to-source capacitance of $D_1$, $C_{D1}$; the larger the value of $C_{D1}$, the larger the voltage ΔV. $C_{D1}$ is a non-linear capacitor whose capacitance value is determined as a function of the gate-to-source voltage and the threshold voltage of the gated diode D1. Note, that $C_{D1}$ will vary depending on the initial state of node N2. Specifically, when the voltage on node N2 is low (e.g., 0), or otherwise below the threshold voltage of the gated diode D1, D1 will be turned off and $C_{D1}$ will be indicative of a parasitic capacitance of node N2 (determined by the parasitic coupling between the gate and the source regions of the gated diode), which is a very small value (e.g., less than one femtofarad (fF)).

When signal GD at node N2 is high, or otherwise above the threshold voltage of the gated diode D1, D1 will be turned on. With the gated diode D1 turned on, $C_{D1}$ will be indicative of not only the off-state parasitic capacitance of D1, but also an inversion channel capacitance of D1, which can be substantially larger than the off-state parasitic capacitance. For example, the inversion channel capacitance of D1 could be as large as about 10 fF for a gated diode D1 with a 10-μm channel width and a 90-nm channel length, which is tens of times larger than the off-state parasitic capacitance of D1. Therefore, a size of D1 (e.g., channel width and/or channel length, or a ratio of channel width to channel length) is ideally selected such that: (i) Vsw+ΔV<Vthinv when GD is low, because ΔV is small in this case; and (ii) Vsw+ΔV>Vthinv when GD is high, because ΔV is large in this case. In this manner, with proper selection of the size of D1, the signal OUT will be a properly sliced version of the sampled input signal IN as captured on node N2. Hence, through the action of the gated diode D1, the receiver 400 is operative to sense the low-swing input signal IN and to amplify this input signal to a full-rail output signal OUT having a voltage swing that is greater than the input signal IN.

Figure 4B:
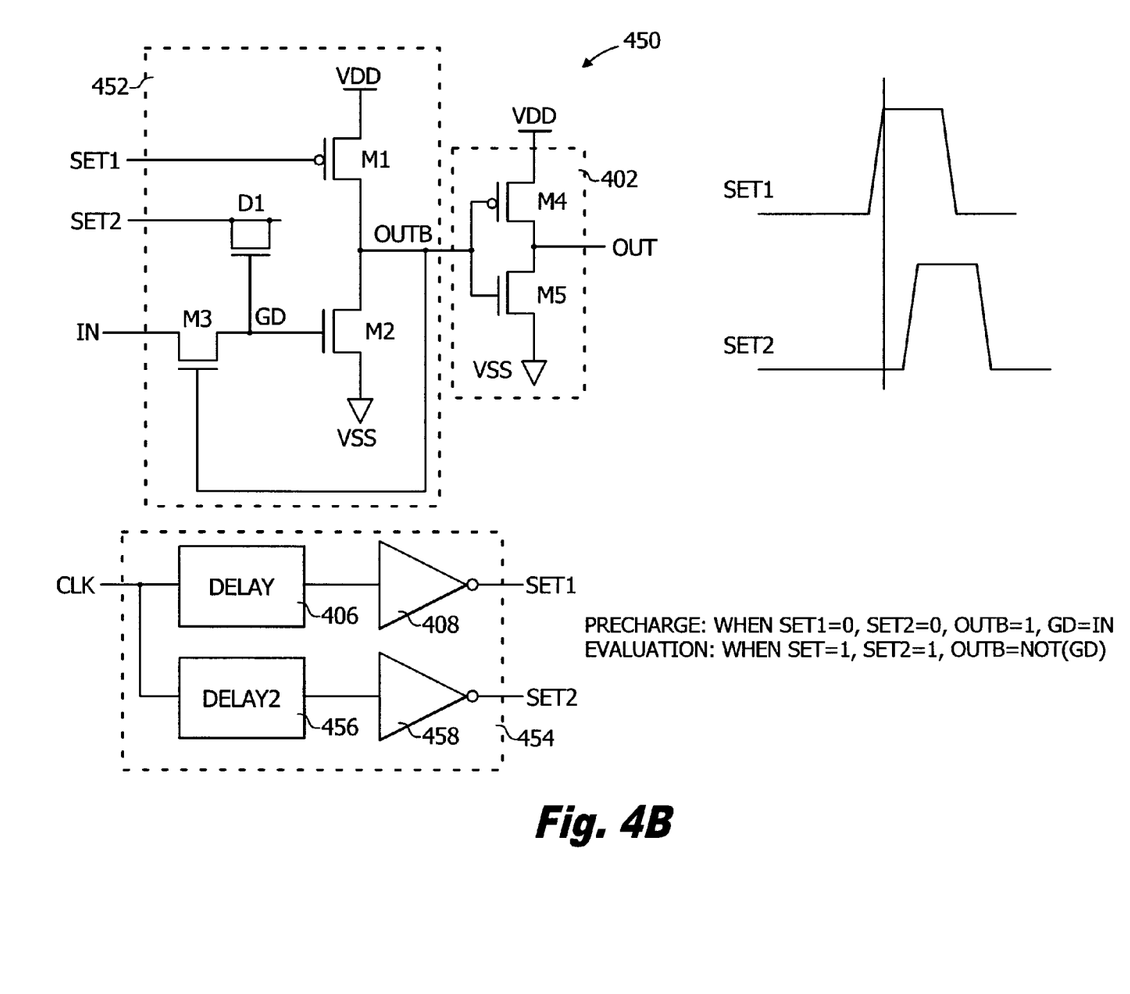
FIG. 4B is a schematic diagram depicting at least a portion of an exemplary low-swing receiver, according to an alternative embodiment of the invention.

Because the respective functions of transistors M1 and D1 are distinct from one another, the source and drain of D1 need not receive the same control signal (SET) as M1. FIG. 4B is a schematic diagram depicting at least a portion of an exemplary low-swing receiver 450, according to an alternative embodiment of the invention. Receiver 450 includes a gated-diode sense amplifier 452, which forms an input stage of the receiver, and an output stage 402 (described in conjunction with FIG. 4A) coupled to the sense amplifier. As apparent from FIG. 4B, sense amplifier 452 is essentially the same as the low-swing sense amplifier 401 shown in FIG. 4A, except that the gate of transistor M1 is adapted to receive a first control signal, SET1, and the source and drain of transistor D1 is adapted to receive a third control signal, SET2. Control signal SET1 is used for precharging transistor M1, and control signal SET2 is used for the gated-diode (D1) operation of signal amplification. When SET2 changes from low to high, the signal GD at the gate of transistor M2 is amplified as a function of the value of the input signal IN, as described above.

Control signals SET1 and SET2 are generated by a signal generator 454 in a manner consistent with the generation of the control signal SET shown in FIG. 4A. Specifically, signal generator 454 includes a first delay element 406 having a first delay, DELAY, associated therewith, connected in series with a first inverter 408 which is operative to generate the control signal SET1. Likewise, signal generator 454 includes a second delay element 456 having a second delay, DELAY2, associated therewith, connected in series with a second inverter 458 which is operative to generate the control signal SET2. Thus, control signals SET1 and SET2 are delayed versions of the clock signal CLK. The phase relationship between SET1 and SET2 is controlled as a function of the delay value of the delay elements 406 and 456, respectively. It is to be understood that the invention is not limited to any specific delay values for DELAY and DELAY2; moreover, DELAY or DELAY2 can be zero.

More particularly, in order to prevent transistors M1 and M2 from turning on at the same time, and thereby generating a large short-circuit current through M1 and M2, a timing between the control signals SET1 and SET2 is preferably configured such that control signal SET1 turns off transistor M1 before the rising edge of control signal SET2, in this embodiment. In other embodiments, depending on the type of transistors (e.g., NMOS or PMOS) employed in the sense amplifier, different timing relationships between signals CLK, SET1 and SET2 can be utilized. Thus, while the control signals SET1 and SET2 can be the same, as in the illustrative embodiment shown in FIG. 4A, it is not necessary for these signals to be the same.

One drawback of the approach depicted in FIGS. 4A and 4B is its large leakage power consumption during the precharge mode, especially in sub-micron technology where transistor leakage current in the subthreshold region can become significant. Specifically, with reference to FIG. 4A, during the precharge mode, the control signal SET is low and signal GD at node N2 is equal to the input signal IN minus a source-to-drain voltage of transistor M3. When IN is about equal to the voltage Vsw, transistor M2 will operate in the subthreshold region. Since transistor M1 is turned on and M2 is operating in its subthreshold region, a short-circuit current through M1 and M2 might be substantial. This result is not desired for low-power I/O applications. In order to reduce the potential for this high leakage current, a new element is beneficially introduced to the gated-diode sense amplifier 401, according to another embodiment of the invention, as will be described in further detail below in conjunction with FIG. 5.

Figure 5:
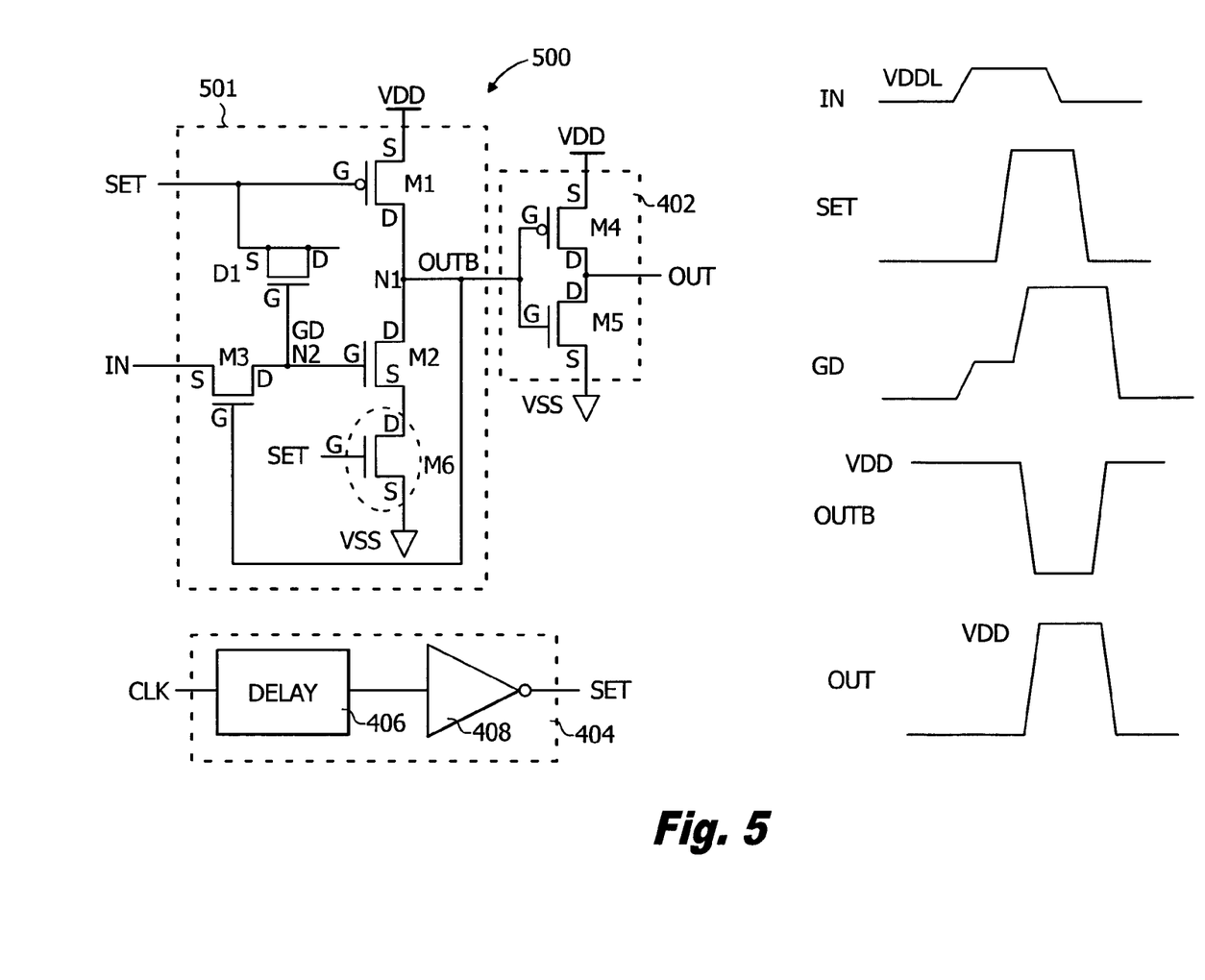
FIG. 5 is a schematic diagram depicting at least a portion of an exemplary low-swing receiver, according to another embodiment of the invention.

FIG. 5 is a schematic diagram depicting at least a portion of an exemplary low-swing receiver 500, according to another embodiment of the invention. The receiver 500 includes a gated-diode sense amplifier 501 which forms an input stage of the receiver. The sense amplifier 501 comprises a first transistor, M1, of a first conductivity type (e.g., PMOS) and first and second transistors, M2 and M6, respectively, of a second conductivity type (e.g., NMOS). A source of transistor M1 is adapted for connection with a first voltage supply, which in this embodiment is VDD, a gate of M1 is adapted for receiving a first control signal, SET, a drain of M1 is connected with a drain of transistor M2 at node N1, a source of M2 is adapted connected with a drain of transistor M6, a gate of M2 is connected with node N2, a source of M6 is adapted for connection with a second voltage supply, which in this embodiment is VSS or ground, and a gate of M6 is adapted for receiving the first control signal SET. Node N1 forms an output of the receiver 500 for generating a first output signal, OUTB. The sense amplifier 501 further includes a third NMOS transistor, M3, or an alternative switching element or circuit, having a drain connected with the gate of transistor M2 at node N2, a gate connected to node N1, and a source adapted for receiving an input data signal, IN. A fourth NMOS transistor, D1, is coupled between the gate of transistor M1 and the gate of transistor M2. Specifically, a drain and a source of transistor D1 are connected with the gate of transistor M1, and a gate of D1 is connected with the gate of transistor M2 at node N2. Transistor D1 is thus connected in a gated-diode configuration operative for signal amplification. It is to be appreciated that transistor D1, in other embodiments, may be configured such that only the source or the drain is connected; that is, the source or the drain of D1 may be left unconnected (i.e., open), as stated above in connection with FIG. 4A.

The receiver 500, like the exemplary receiver 400 shown in FIG. 4A, may, optionally, include an output stage 402 having an input connected with node N1 and adapted to receive the first output signal OUTB, and an output adapted to generate a second output signal, OUT. In this embodiment, the output stage 402 is implemented as an inverting output stage and comprises a PMOS transistor, M4, and an NMOS transistor, M5, connected together in a standard inverter configuration as previously described. With the output stage 402 connected in this manner, the second output signal OUT will be a logical complement of the first output signal OUTB. It is to be understood that the invention is not limited to an inverting output stage. Output stage 402 enables the receiver 500 to drive an external load without affecting the internal nodes of the receiver.

The receiver 500 may include a signal generator circuit 404 operative to generate the first control signal SET as a function of a second control signal, which in this embodiment is a clock signal, CLK. As described in conjunction with FIG. 4A, the first control signal SET generated at an output of the signal generator circuit 404 will be a delayed version of the clock signal CLK supplied thereto.

In terms of operation, the receiver 500 operates in a manner similar to the receiver 400 shown in FIG. 4A and discussed above. The addition of transistor M6 to the receiver 500, having its gate controlled by the first control signal SET, essentially eliminates the large leakage power consumption during the precharge mode of operation. More particularly, during the precharge mode, the control signal SET is low (e.g., 0 volts) and transistor M6 is turned off. Through this new mechanism, transistor M6 effectively breaks the leakage current path through transistors M1 and M2, regardless of the level of input signal IN, thereby eliminating the undesirably leakage power consumption in the receiver 500. Thus, transistor M6 functions as a control circuit operative to selectively disconnect transistor M2 from VSS as a function of the control signal SET.

It is to be understood that in the sense amplifier 501, like in the sense amplifier 401 depicted in FIG. 4B, the source and drain of transistor D1 need not receive the same control signal as transistor M1. Rather, in accordance with alternative embodiments, the gate of transistor M1 may be adapted to receive a first control signal, and the source and drain of transistor D1 may be adapted to receive a different control signal. In this manner, the precharging of transistor M1 can be made independent of the small signal amplification provided by transistor D1.

Figure 6:
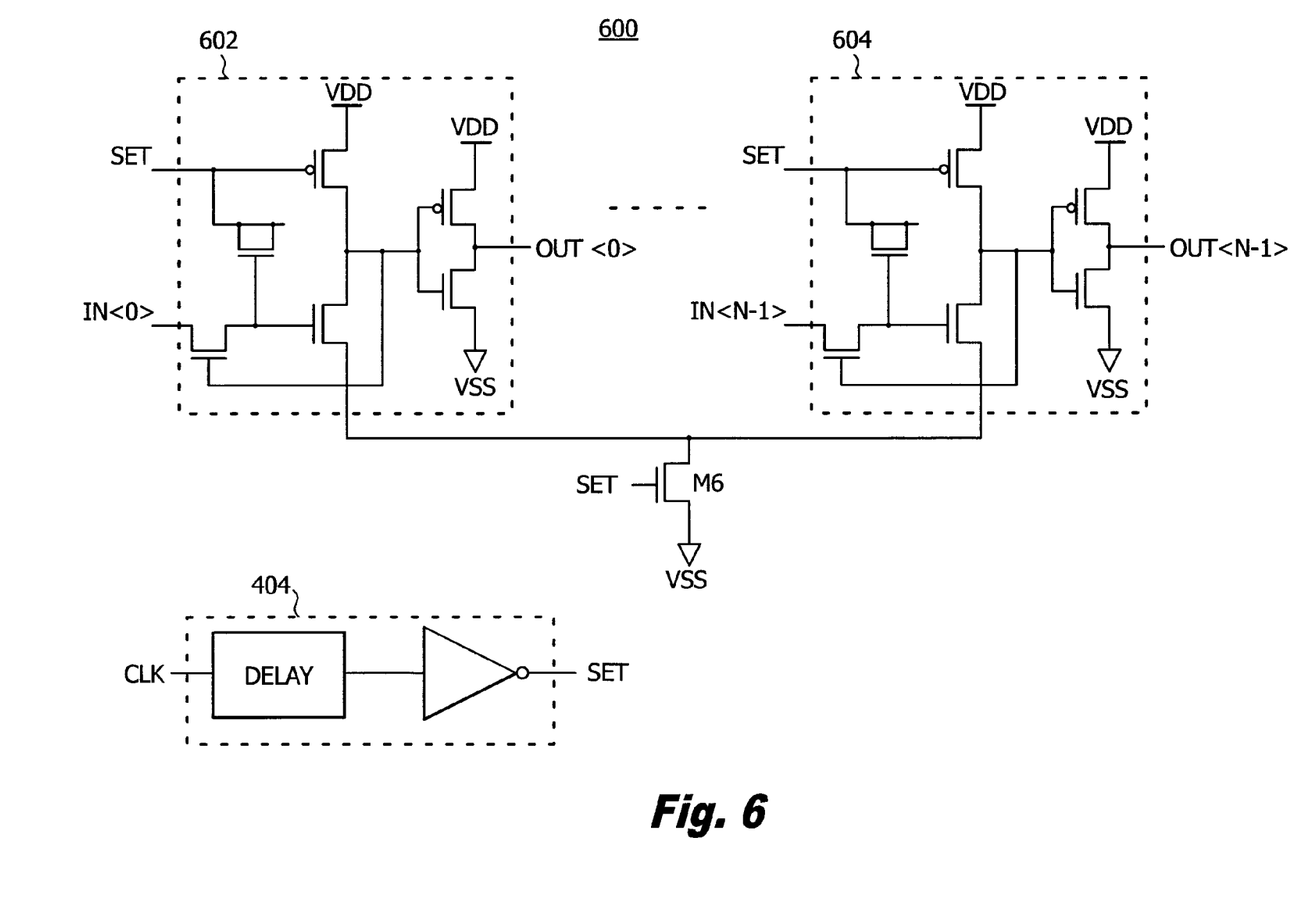
FIG. 6 is a schematic diagram depicting at least a portion of an exemplary low-swing I/O bus circuit, according to an embodiment of the invention.

The beneficial approach shown in FIG. 5 can be further extended to low-swing I/O bus designs, in accordance with other embodiments. By way of example only, FIG. 6 is a schematic diagram depicting at least a portion of an exemplary low-swing I/O bus (i.e., interface) circuit 600, according to an embodiment of the invention. Bus circuit 600 includes a plurality of low-swing receivers, 602 through 604. A first receiver 602 (receiver 0) is adapted to receive a first low-swing data input signal, IN<0>, and to generate, as a function thereof, a first output signal, OUT<0>. Likewise, an Nth receiver 604 (receiver N−1) is adapted to receive an Nth low-swing data input signal, IN<N−1>, and to generate, as a function thereof, an Nth output signal, OUT<N−1>, where N is an integer. Each of at least a subset of the receivers 604, 606 may be implemented in a manner consistent with the receiver 500 shown in FIG. 5, although the invention is not limited to the receiver configuration shown in FIG. 5. However, as apparent from FIG. 6, rather than each receiver including its own leakage control transistor M6, all or at least a subset of the N receivers in the bus circuit 600 share the same leakage control transistor M6, thereby reducing the overall size of the bus circuit. Moreover, the loading of the signal generator circuit 404 driving the SET signal can be reduced as compared to introducing an instance of transistor M6 in each receiver, thus further reducing overall power consumption.

Subject to the variations of the integrated circuit (IC) fabrication process (e.g., random dopant fluctuation in sub-micron technology), supply voltage and temperature (PVT) conditions, both the inverter threshold voltage in the receiver, Vthinv, and the voltage, ΔV, coupled through D1 (see, e.g., FIG. 4A) may be different from the as-designed desired voltage. To make the receiver work reliably across a wide range of PVT conditions, therefore, calibration of the sense amplifier in the receiver is preferably performed.

Figure 7:
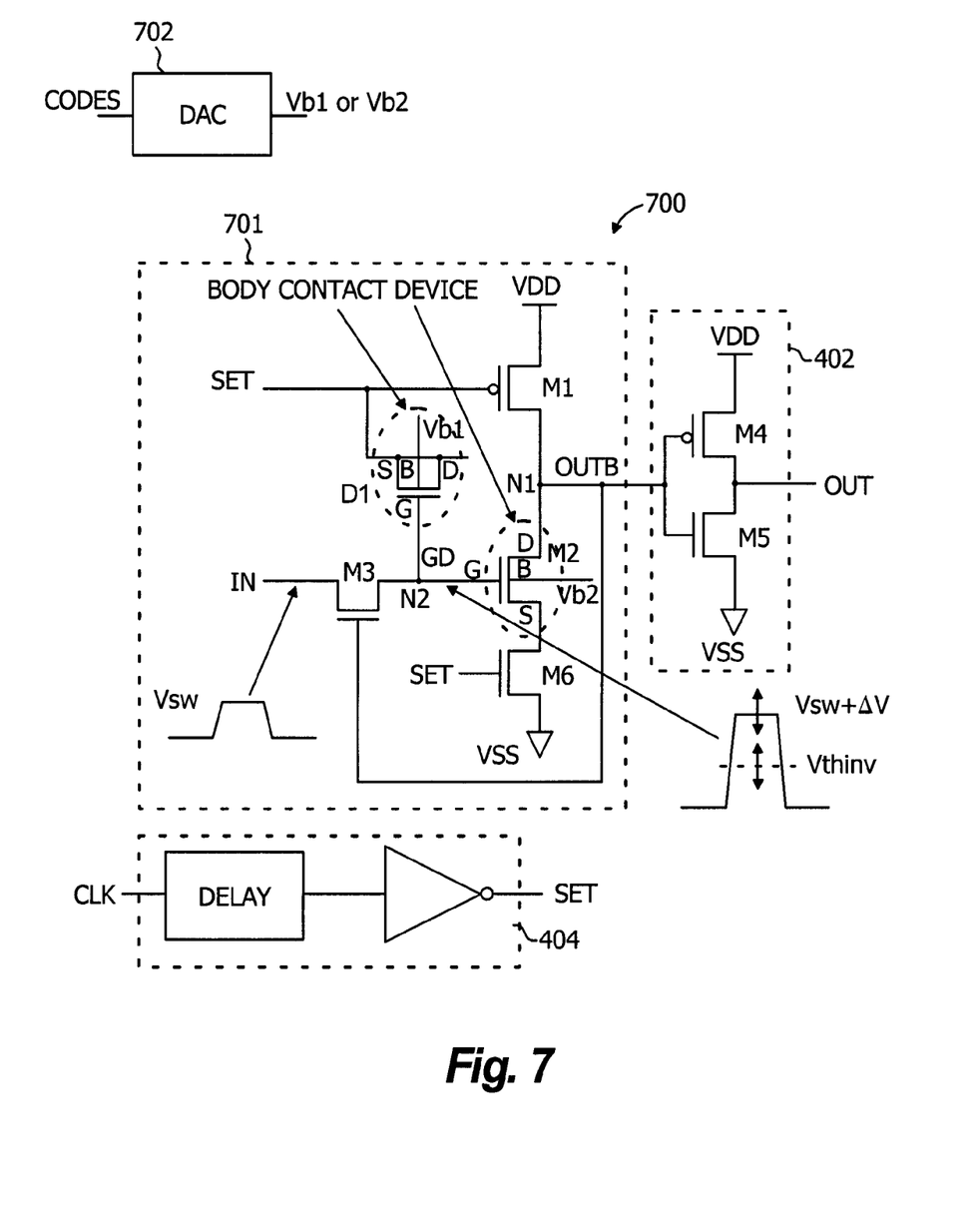
FIG. 7 is a schematic diagram depicting at least a portion of an exemplary low-swing receiver including calibration circuitry and conceptually illustrating a receiver calibration methodology, according to an embodiment of the invention.

FIG. 7 is a schematic diagram depicting at least a portion of an exemplary low-swing receiver 700 including calibration circuitry and conceptually illustrating a receiver calibration methodology, according to an embodiment of the invention. The receiver 700, like the receiver 500 shown in FIG. 5, includes a gated-diode sense amplifier 701 which forms an input stage of the receiver. Optionally, the receiver 700 includes an output stage 402, which may be implemented as a standard inverter in a manner consistent with the output stage depicted in FIG. 4A. It is to be appreciated, however, that the invention is not limited to the specific output stage shown. The sense amplifier 701 is essentially the same as the exemplary sense amplifier 501 shown in FIG. 5, except that the transistors D1 and M2 are shown in FIG. 7 as body contact devices. It is to be understood, however, that the calibration techniques according to embodiments of the invention may be employed with any essentially receiver circuit in which an output voltage generated by the receiver can be monitored and fed back to control device body voltage for adjusting an effective threshold voltage of the receiver.

With reference to FIG. 7, transistor D1 includes a bulk or body contact (B) adapted for connection to a first prescribed voltage, Vb1. Likewise, transistor M2 includes a bulk or body contact adapted for connection to a second prescribed voltage, Vb2. Voltages Vb1 and Vb2 are considered bias voltages operative to control an operating point of transistors D1 and M2, respectively. Either one or both of the bias voltages Vb1 and Vb2 can be used to perform a calibration of the receiver 700. It is to be appreciated that, in an alternative embodiment (not explicitly shown), transistor M1 may also include a body contact which can be used for applying a bias voltage operative to control an operating point of the device in a manner consistent with devices D1 and M2. In this fashion, the effective switching threshold of sense amplifier can be controlled by adjusting the respective bias voltages applied to the corresponding body contacts of devices D1, M1 and/or M2, either independently or in combination.

The voltages Vb1 and/or Vb2, in this embodiment, are generated by calibration circuitry comprising one or more digital-to-analog converters (DAC) 702 in the receiver 700. Alternatively, the voltages Vb1 and/or Vb2 can be generated by circuitry (e.g., voltage generator) external to the receiver 700 and supplied thereto. The voltages Vb1 and Vb2 are preferably controlled independently of one another, although in some embodiments, the same voltage may be used for both Vb1 and Vb2.

By way of example only and without loss of generality, FIG. 7 illustrates two approaches to calibrating the gated-diode sense amplifier-based low-swing receiver 700. In a first approach, the switching threshold voltage Vthinv of the inverter forming the output stage 402 (e.g., transistors M4 and M5) is adjusted (i.e., selectively controlled), which can be achieved in a number of ways, including but not limited to controlling the body voltage Vb2 of transistor M2. Since a MOS transistor's threshold voltage changes as a function of a voltage difference between the body node and the source, the voltage Vthinv will change as a function of Vb2. Note, that other inverter threshold voltage adjustment techniques can also be applied, such as, for example, tuning the W/L ratio of the transistor M2, according to other embodiments. In a second calibration approach, the incremental voltage ΔV coupled through transistor D1 is adjusted, which can be achieved in a number of ways, including but not limited to controlling the body voltage Vb1 of transistor D1. This second calibration approach affects the effective capacitance of D1, which in turn changes the coupled signal ΔV on node N2.

As previously stated, the voltage(s) Vb1 and/or Vb2 can be controlled by corresponding digital-to-analog converters (DACs) 702 as a function of an input digital code word supplied to the DAC(s). Such an implementation would help simplify the enablement of an automatic, on-chip calibration procedure used in conjunction with on-chip calibration digital logic circuitry (not explicitly shown).

Figure 8:
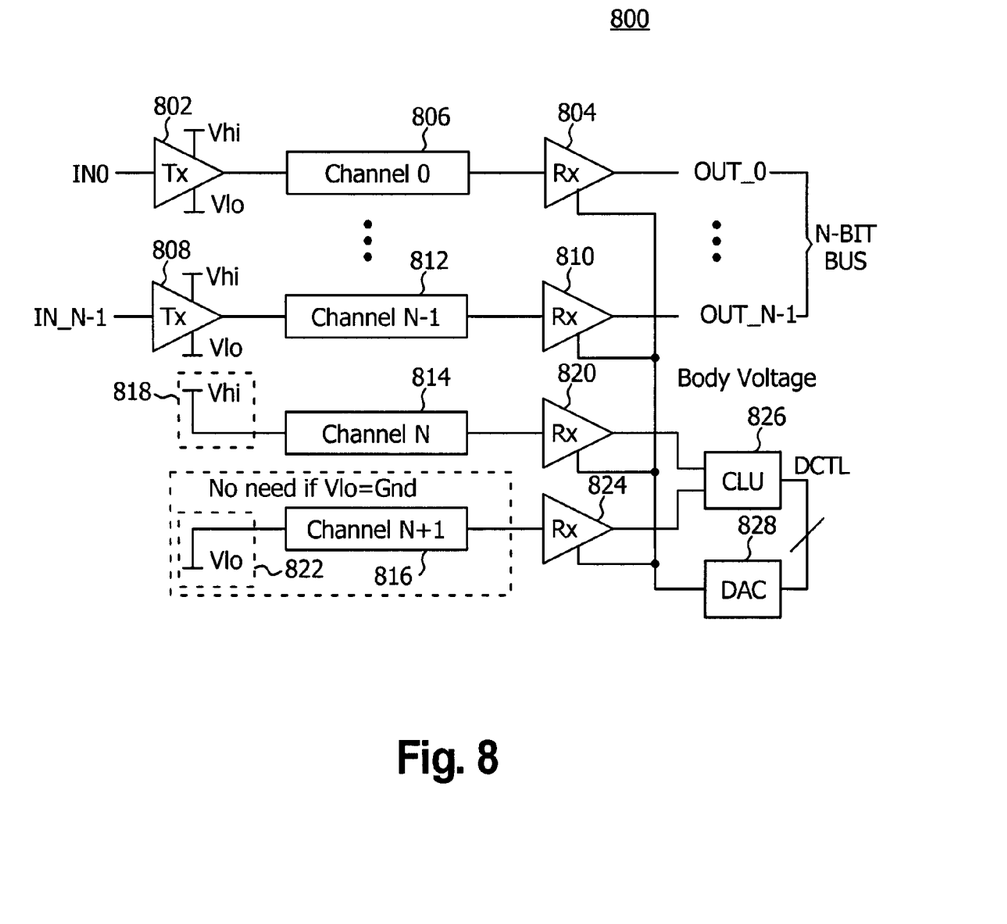
FIG. 8 is a block diagram depicting at least a portion of an exemplary bus-level calibration methodology, according to an embodiment of the invention.

At the bus level, as shown, for example, in FIG. 6, there are various ways contemplated for implementing a calibration procedure, as will become apparent to those skilled in the art given the teachings herein. FIG. 8 is a block diagram depicting at least a portion of an exemplary bus-level calibration methodology, according to an embodiment of the invention. The exemplary calibration methodology shown in conjunction with FIG. 8 is relatively simple and requires little design overhead, and is therefore advantageous. With reference to FIG. 8, an illustrative data communication system 800 includes a plurality of low-swing transmitters, a plurality of low-swing receivers, and a plurality of communication channels established between each of the transmitters and a corresponding one of the receivers. Specifically, the system 800 includes a first low-swing transmitter (Tx) 802 coupled with a first low-swing receiver (Rx) 804 via a first data channel (Channel 0) 806, and an Nth low-swing transmitter 808 coupled with an Nth low-swing receiver 810 via an Nth data channel (Channel N−1) 812, where N is an integer greater than one. Each of the transmitters 802, 808 is operative to receive a corresponding input signal, IN_0 through IN_N−1, respectively, and to generate a low-swing output signal having a swing referenced between two voltages, Vhi and Vlo, which is conveyed by the corresponding data channel to which the transmitter is connected. Each of the receivers 804, 810 is operative to receive, from the corresponding channel, the low-swing signal generated by the corresponding transmitter and to generate a full-swing output signal, OUT_0 through OUT_N−1, respectively, which collectively form an N-bit bus. It is to be appreciated that the invention is not limited to any specific values for the voltages Vhi and Vlo; for example, Vlo can be ground or zero volt, and Vhi can be about 0.3 volt when the supply voltage is 1.0 volt.

In this approach, there are two additional data channels, 814 and 816, connecting corresponding transmitters and receivers beyond the N required for the N-bit bus. More particularly, a first additional channel 814 connects a transmitter 818 with a corresponding receiver 820; the transmitter 818 in this embodiment is implemented as a simple connection to Vhi, although alternative transmitter circuitry is contemplated (e.g., dummy load). A second additional channel 816 connects a transmitter 822 with a corresponding receiver 824; the transmitter 822 in this embodiment is implemented as a simple connection to Vlo, although alternative transmitter circuitry is contemplated. Receivers 820 and 824 may be considered a monitoring circuit for evaluating an effective switching threshold of the receivers 804 through 810 over variations in at least one of process, temperature and voltage (PVT) conditions to which the receivers are subjected. It is to be understood that, in the case where Vlo is equal to ground (e.g., zero volts), channel 816 and transmitter 822 can be eliminated and an input of receiver 824 is connected directly to ground.

On the receiver side, the respective outputs of receivers 820 and 824 are supplied to a control logic unit (CLU) 826. The CLU 826 is operative to sweep the inverter threshold voltage in the receivers 820 and 824 to ensure that the output signals from these two receivers are logically 1 and 0, respectively. The CLU 826 can then set the inverter threshold voltage to a prescribed position (e.g., in the center of the valid range), as may be optimal or desired. Each of the N data receivers 804 through 810 are preferably set to the same inverter threshold voltage as that in the pair of calibration receivers 820 and 824. To accomplish this, the CLU 826 is operative to generate a digital control signal, DCTL, which may be a digital word, which is supplied to a digital-to-analog converter (DAC) 828. The DAC 828 is operative to generate one or more appropriate control signals (e.g., Vb1 and/or Vb2) for controlling a body voltage of one or more corresponding transistor devices (e.g., transistors D1 and/or M2 in FIG. 7) in the low-swing receivers 804 through 810, consistent with the methodology previously described in conjunction with FIG. 7. Alternatively, an effective size (e.g., channel width and/or channel length), or other parameter(s), of one or more corresponding transistor devices in the low-swing receivers 804 through 810 may be adjusted to thereby control the respective inverter threshold voltages in the receivers.

For each N-bit data bus in a chip, since the receivers are very compact and can therefore be very densely disposed relative to one other, it is reasonable to assume that systematic variation in respective inverter threshold voltages for all the receivers 804 through 810 will be well-compensated by this approach. The calibrated threshold voltage can also be applied to other data buses within a certain proximity of the calibration receivers 820 and 824. For other distant data buses, another local copy of the calibration circuitry (e.g., including CLU 826, DAC 828, and the calibration receiver circuitry) can be added. More complex approaches involving partial or full round-robin calibration could also be introduced by those skilled in the art given the teachings herein and are contemplated within the scope of the present invention; such schemes would enable compensation of a broader class of random and systematic offsets in inverter threshold at the expense of additional calibration complexity and coefficient storage resources.

A low-swing I/O infrastructure according to embodiments of the invention, suitable for on-chip and inter-chip data communication, includes at least three primary components; namely, a low-swing transmitter, a low-swing receiver, and a communication channel establish between the transmitter and receiver. The low-swing transmitter comprises a low-voltage driver that transmits single-ended or differential reduced-swing signals. Embodiments of the low-swing receiver are based on a gated-diode sense/amplifier circuit that has very high signal sensitivity. The low-swing input signal is sensed and amplified to a full CMOS level. Due to its effective signal amplification scheme and simple circuit topology, the receiver is very power and area efficient. Furthermore, the gated-diode sense/amplifier receiver handles single-ended signaling, which, compared to differential signaling approaches, approximately doubles the data bandwidth supportable in the same wiring space (in certain cases, single-ended signaling may require space for signal shielding to improve the signal integrity). The channel connects the transmitter to the receiver. The transmitter and receiver can be on the same chip or on different chips. The channel can be comprised of a number of interconnect elements, including, but not limited to, on-chip wiring, off-chip silicon carrier wiring, off-chip standard interconnect wiring, inter-chip interconnects in a 3D chip stack, etc., or various combinations of the foregoing. An important advantage of the low-swing signaling techniques according to embodiments of the invention is that due to the simple yet highly sensitive gated-diode sensing circuit-based receiver, the receiver advantageously requires a smaller area and consumes less power compared to conventional low-swing I/O schemes. Furthermore, the low-swing signaling techniques according to embodiments of the invention are digitally friendly, thereby enabling the low-swing I/O circuit to be easily integrated with an automated digital chip design flow.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with the present invention can be employed in essentially any data communication application and/or electronic system. Suitable systems for implementing techniques of the invention may include, but are not limited to, data communication systems, networking systems, I/O interface circuitry, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A receiver adapted to receive an input signal having a first voltage swing and to generate an output signal having a second voltage swing, the output signal being indicative of the input signal, the second voltage swing being greater than the first voltage swing, the receiver comprising:
    at least one sense amplifier, the at least one sense amplifier comprising:
        a first transistor of a first conductivity type, the first transistor having a first source/drain adapted for connection with a first voltage supply, a gate adapted for receiving a first control signal, and a second source/drain;
        a second transistor of a second conductivity type, the second transistor having a first source/drain adapted for connection with a second voltage supply, a second source/drain connected to the second source/drain of the first transistor and forming a first output of the sense amplifier, and a gate adapted for connection with a second control signal via a capacitive element; and
        a switching circuit operative to selectively couple the input signal with the gate of the second transistor as a function of a third control signal, the third control signal being indicative of a voltage generated at the first output of the sense amplifier;
    wherein the sense amplifier is operative in a first mode to store charge in the capacitive element, and is operative in a second mode to impart a voltage on the gate of the second transistor which is indicative of the charge stored in the capacitive element.

2. The receiver of claim 1, wherein the capacitive element comprises a third transistor configured in a gated-diode connection arrangement.

3. The receiver of claim 2, wherein the third transistor comprises an MOS device having a first source/drain and a second source/drain adapted for connection with the second control signal, and a gate connected with the gate of the second transistor.

4. The receiver of claim 1, wherein the capacitive element has a capacitance associated therewith that varies as a function of at least one of the second control signal and the input signal.

5. The receiver of claim 1, wherein the voltage imparted on the gate of the second transistor by the capacitive element, in conjunction with a peak voltage of the input signal, is sufficient to turn on the second transistor when the second control signal transitions to a high logic level.

6. The receiver of claim 1, wherein the at least one sense amplifier further comprises an output stage connected with the first output, the output stage being operative to generate the output signal of the receiver as a function of the signal generated at the first output.

7. The receiver of claim 1, wherein the at least one sense amplifier further comprises a signal generator circuit operative to receive a clock signal supplied to the sense amplifier and to generate the first and second control signals, the first and second controls signal being respective delayed representations of the clock signal.

8. The receiver of claim 1, wherein the at least one sense amplifier further comprises a control circuit operative to selectively disconnect the second transistor from the second voltage supply as a function of the first control signal.

9. The receiver of claim 8, wherein the control circuit comprises a third transistor having a first source/drain adapted for connection with the second voltage supply, a second source/drain connected with the first source/drain of the second transistor, and a gate adapted to receive the first control signal.

10. The receiver of claim 1, wherein at least one of a channel width and a channel length of the capacitive element is selected such that: (i) a peak voltage of the input signal summed with an incremental voltage coupled through the capacitive element is less than a switching threshold of an effective inverter comprising the first transistor and the second transistor when a voltage generated at the gate of the second transistor is at a logic low level; and (ii) the peak voltage of the input signal summed with the incremental voltage is greater than the switching threshold of the effective inverter comprising the first transistor and the second transistor when the voltage generated at the gate of the second transistor is at a logic high level.

11. The receiver of claim 1, wherein the at least one sense amplifier further comprises a calibration circuit operative to monitor a switching threshold of the sense amplifier and to adjust at least one parameter of at least one transistor in the sense amplifier for controlling the switching threshold of the sense amplifier.

12. The receiver of claim 11, wherein the calibration circuit is operative to monitor a voltage generated at the first output and to generate at least a fourth control signal for controlling a body voltage of at least one transistor in the sense amplifier as a function of the voltage generated at the first output.

13. The receiver of claim 12, wherein the calibration circuit comprises a digital-to-analog converter operative to receive a digital input word indicative of the switching threshold of the sense amplifier and to generate the fourth control signal as a function of the digital input word.

14. The receiver of claim 11, wherein the calibration circuit is operative to control a body voltage of at least one of the second transistor and the capacitive element as a function of the voltage generated at the first output.

15. The receiver of claim 11, wherein the calibration circuit is operative to adjust a channel width-to-length ratio of at least one of the second transistor and the capacitive element as a function of the voltage generated at the first output.

16. The receiver of claim 1, wherein the first and second control signals are the same.

17. The receiver of claim 1, wherein a timing relationship between the first and second control signals is configured such that the first control signal transitions to a logic high level before the second control signal transitions to a logic high level.

18. The receiver of claim 1, wherein the capacitive element comprises an MOS device having a first source/drain adapted for connection with the second control signal, a second source/drain that is unconnected, and a gate connected with the gate of the second transistor.

19. An input/output (I/O) interface circuit, the I/O interface circuit including a plurality of receivers, each of at least a subset of the receivers being adapted to receive an input signal having a first voltage swing and to generate an output signal having a second voltage swing, the second voltage swing being greater than the first voltage swing, at least one of the receivers comprising:

at least one sense amplifier, the at least one sense amplifier comprising:
a first transistor of a first conductivity type, the first transistor having a first source/drain adapted for connection with a first voltage supply, a gate adapted for receiving a first control signal, and a second source/drain;
a second transistor of a second conductivity type, the second transistor having a first source/drain adapted for connection with a second voltage supply, a second source/drain connected to the second source/drain of the first transistor and forming a first output of the sense amplifier, and a gate adapted for connection with a second control signal via a capacitive element; and
a switching circuit operative to selectively couple the input signal with the gate of the second transistor as a function of a third control signal, the third control signal being indicative of a voltage generated at the first output of the sense amplifier;
wherein the sense amplifier is operative in a first mode to store charge in the capacitive element, and is operative in a second mode to impart a voltage on the gate of the second transistor which is indicative of the charge stored in the capacitive element.

20. The I/O interface circuit of claim 19, further comprising a control circuit coupled with at least a subset of the plurality of receivers, the control circuit being operative to selectively disconnect the second transistor from the second voltage supply in at least two of the receivers as a function of the first control signal.

21. The I/O interface circuit of claim 20, wherein the control circuit comprises a transistor having a first source/drain adapted for connection with the second voltage supply, a second source/drain connected with the first source/drain of the second transistor in at least two of the plurality of receivers, and a gate adapted to receive the first control signal.

22. The I/O interface circuit of claim 19, further comprising a signal generator circuit operative to receive a clock signal supplied to the I/O interface circuit and to generate the first and second control signals, the first and second control signals being respective delayed representations of the clock signal.

23. The I/O interface circuit of claim 19, further comprising at least one calibration circuit, the calibration circuit being operative to monitor an effective switching threshold of at least one of the plurality of receivers and to adjust at least one parameter of at least one transistor in the sense amplifier in at least a subset of the receivers for controlling the switching threshold of the sense amplifier.

24. The I/O interface circuit of claim 23, wherein the at least one calibration circuit comprises:
a monitoring circuit operative to measure an effective switching threshold of the receivers over variations in at least one of process, temperature and voltage (PVT) conditions to which the receivers are subjected; and
a control circuit coupled with the monitoring circuit and operative to generate a fourth control signal indicative of the effective switching threshold of the receivers for adjusting at least one parameter associated with at least one transistor in the sense amplifier in at least a subset of the receivers to thereby control the switching threshold of the corresponding receiver.

25. The I/O interface circuit of claim 24, wherein the monitoring circuit comprises a pair of dummy receivers, a first receiver of the pair of dummy receivers operative to receive a logic high input signal and a second receiver of the pair of dummy receivers operative to receive a logic low input signal, the monitoring circuit being operative to sweep a switching threshold voltage in each of the first and second receivers to ensure that output signals generated by the first and second receivers correspond to logic high and logic low levels, respectively, over variations in PVT conditions.

26. The I/O interface circuit of claim 24, wherein the control circuit comprises a digital-to-analog converter operative to receive a digital input word indicative of the effective switching threshold of the receivers and to generate the fourth control signal as a function of the digital input word.

27. The I/O interface circuit of claim 23, wherein the calibration circuit is operative to control a body voltage of at least one of the second transistor and the capacitive element in each of at least a subset of the receivers as a function of the effective switching threshold of at least one of the plurality of receivers.

* * * * *